US010992323B2

(12) United States Patent
Xie et al.

(10) Patent No.: US 10,992,323 B2
(45) Date of Patent: Apr. 27, 2021

(54) EARLY DECODING TERMINATION FOR A MEMORY SUB-SYSTEM

(71) Applicant: MICRON TECHNOLOGY, INC., Boise, ID (US)

(72) Inventors: Tingjun Xie, Milpitas, CA (US); Ying Yu Tai, Mountain View, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 16/265,693

(22) Filed: Feb. 1, 2019

(65) Prior Publication Data

US 2020/0252087 A1 Aug. 6, 2020

(51) Int. Cl.
| G06F 11/10 | (2006.01) |
| G06F 11/00 | (2006.01) |
| H03M 13/00 | (2006.01) |
| H03M 13/09 | (2006.01) |
| H03M 13/37 | (2006.01) |

(52) U.S. Cl.
CPC ..... *H03M 13/3738* (2013.01); *G06F 11/1076* (2013.01); *H03M 13/09* (2013.01)

(58) Field of Classification Search
None
See application file for complete search history.

(56) References Cited

U.S. PATENT DOCUMENTS

| 7,117,418 | B2* | 10/2006 | Thesling | ........... H03M 13/2963 714/755 |
| 7,810,014 | B2 | 10/2010 | Kim et al. | |
| 8,484,531 | B1* | 7/2013 | Varnica | .............. H03M 13/1142 714/758 |
| 8,621,321 | B2* | 12/2013 | Steiner | .................. H03M 13/09 714/758 |
| 9,503,126 | B2* | 11/2016 | Vardy | .................... H03M 13/13 |
| 9,628,113 | B2* | 4/2017 | Jeong | ................ H03M 13/2906 |
| 2009/0077457 | A1 | 3/2009 | Ramesh et al. | |
| 2011/0214029 | A1 | 9/2011 | Steiner et al. | |
| 2014/0223255 | A1 | 8/2014 | Lu et al. | |

FOREIGN PATENT DOCUMENTS

| KR | 20180010849 A | 1/2018 |
| WO | 2018191908 A1 | 10/2018 |

OTHER PUBLICATIONS

PCT Notification of Transmittal of the International Search Report and the Written Opinion of the International Searching Authority for PCT Application No. PCT/US2020/016263, dated May 28, 2020 11 pages.

* cited by examiner

*Primary Examiner* — Justin R Knapp
(74) *Attorney, Agent, or Firm* — Lowenstein Sandler LLP

(57) ABSTRACT

A decoder can receive an indication that a portion of a codeword has been decoded during a decoding operation. The decoder can determine a group of candidate output values of the decoding operation for the portion of the codeword, and eliminate one or more candidate output values from the group of candidate output values based on a decoded check code for each of the group of candidate output values. In response to determining that all of the candidate output values have been eliminated from the group of candidate output values, the decoder can terminate the decoding operation.

20 Claims, 7 Drawing Sheets

EARLY DECODING TERMINATION FOR A MEMORY SUB-SYSTEM

TECHNICAL FIELD

The present disclosure generally relates to a memory sub-system, and more specifically, relates to early decoding termination for memory sub-systems.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
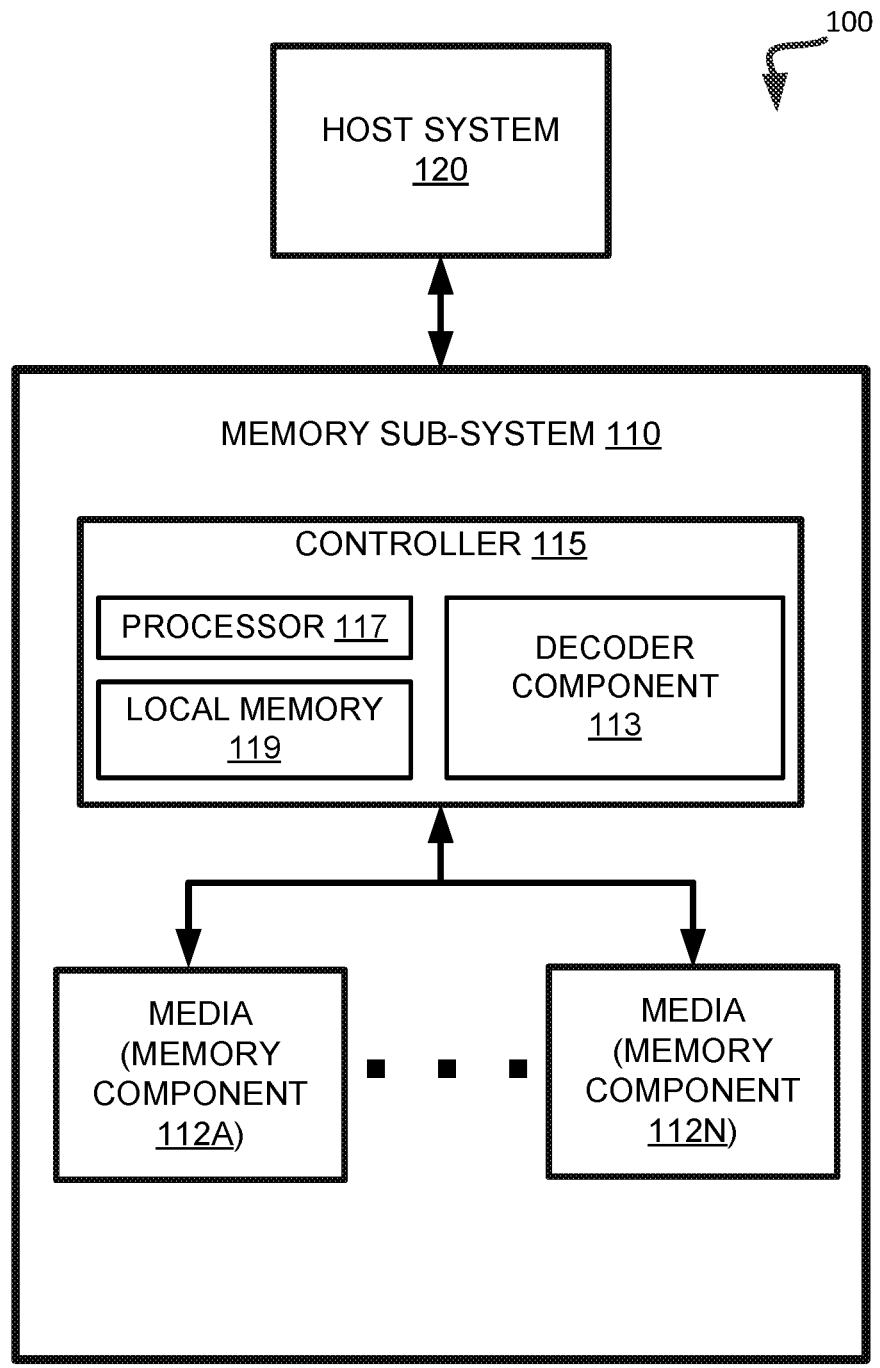
FIG. 1 illustrates an example computing environment that includes a memory sub-system in accordance with some embodiments of the present disclosure.

Aspects of the present disclosure are directed to early decoding termination for memory sub-systems. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. The memory sub-system can be a hybrid memory/storage sub-system. In general, a host system can utilize a memory sub-system that includes one or more memory components. The host system can provide data to be stored at the memory sub-system and can request data to be retrieved from the memory sub-system.

A conventional memory sub-system can implement an error detection and correction (i.e., an error control) operation for the data that is stored at and/or retrieved from the memory components of the memory sub-system. The error control operation can utilize an error correcting code (ECC) to encode host data and store the encoded host data at the memory sub-system. For example, the host data can be encoded to generate a codeword and the codeword can be stored at the memory sub-system. Subsequently, when the host system requests the host data, the codeword can be decoded to generate the host data. The encoding and decoding of the error control operation can be used to detect any errors that may have been caused by noise or other such impairments that can cause a value or bit of the host data to switch (e.g., from a '0' value to a '1' value or vice versa) when the host data is stored or read. The detected error can subsequently be corrected based on the error control operation.

The error correcting code utilized by the error control operation of the conventional memory sub-system can be designed based on sequential encoding and decoding for data stored at the conventional memory sub-system. In some memory sub-systems, data can be encoded as codewords and each codeword can be made up of multiple segments, where each segment can include a sector of host data along with an associated check code for that sector of host data (i.e., a sector check code). The sector check code can be used to validate the integrity of the host data in that particular sector. Additionally, a codeword can include a global check code that can be used to validate the integrity of the host data for all sectors included in the codeword.

Conventional memory sub-systems that encode and store codewords in this manner can experience difficulties in subsequent decoding of these codewords. In many instances, conventional memory sub-systems decode an entire codeword sequentially before conducting any error handling, which can significantly reduce processing efficiency. This can often increase execution time and decrease overall performance since the decoding process and error handling are typically implemented as separate operations. The decoding process can often attempt to decode the entire codeword before executing any error check process, analyzing all potential candidates for the decoded data of all host data sectors in a codeword. Thus, errors present in host data sectors that are positioned at the beginning (or near the beginning) of the codeword are typically not processed until the entire codeword has been decoded. As a result, the decoding operation can often spend both unnecessary time and computing resources on decoding data that can later be determined to be invalid and then discarded.

Additionally, conventional memory sub-systems typically store codewords using a particular size that can often be different (either much larger or much smaller) than the amount of data requested for host data by the host system. For example, a codeword can be stored with a size of 2 k (2 kilobytes) whereas a request for host data that only needs the first 1 k (1 kilobyte) can be received. In such instances, the decoding operation of a conventional memory sub-system often identifies the 2 k codeword that stores the requested data and attempts to decode the entire 2 k codeword. As a result, the decoding operation can often spend both unnecessary time and computing resources on decoding data that is not needed to satisfy the request.

Aspects of the present disclosure address the above and other deficiencies by implementing early decoding termination for memory sub-systems. In some embodiments, a polar decoder can be used for the early decoding termination and data generation for the memory sub-system. The polar decoder can perform the decoding operation in stages such that each potential candidate's decoded host data sector can be validated using its corresponding decoded check code for that sector before continuing on to the next sector. If no potential candidates can pass the validation process, the polar decoder can terminate the decoding process without continuing to decode the remaining host data sectors of the codeword. Moreover, the polar decoder can regulate the execution of the decoding process based on the number of host data sectors of a codeword necessary to satisfy a request from a host system. For example, once the number of host data sectors needed to satisfy the request have been decoded, the polar decoder can terminate the decoding process without continuing to decode the remaining host data sectors of the codeword.

Advantages of the present disclosure include, but are not limited to, improved latency in based on early output of requested data as well as earlier termination of failed decoding. By decoding a codeword in stages, potential errors in encoded host data sectors can be identified earlier in the decoding process. Thus, computational resource usage of the memory sub-system can be dramatically reduced by terminating the process before computing resources are wasted on decoding subsequent sectors for the encoded host data that includes errors. Similarly, by assessing the decoded data as each host data sector is decoded, the amount of decoded data necessary to satisfy received requests can be identified earlier. Again, computational resource usage of the memory sub-system can be dramatically reduced by terminating the process before resources are wasted on decoding subsequent sectors that contain data not needed to satisfy the request, thereby further improving the efficiency of the decoding process.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a decoder component 113 that can be used to decode the codewords to generate host data. In some embodiments, the controller 115 includes at least a portion of the decoder component 113. For example, the controller 115 can include a processor 117 (processing device) configured to execute instructions stored in local memory 119 for performing the operations described herein. In some embodiments, the decoder component 113 is part of the host system 120, an application, or an operating system.

The decoder component 113 can receive a request for host data stored in memory components 112A to 112N, retrieve the codeword associated with the host data, and perform a decoding operation (e.g., a polar decoding operation) on the codeword. The decoder component 113 can determine a group of potential candidate output values of the decoding operation, and subsequently eliminate one or more of the potential candidate output values based on a decoded check code for each of the potential candidates. If all of the potential candidates are eliminated, the decoding process can be terminated before decoding any additional host data sectors of the codeword. If there are some candidate output values that have not been eliminated, the decoder component 113 can continue the decoding operation. Additionally, after receiving a request for host data, the decoder component 113 can receive a codeword that is associated with the requested data, perform a decoding operation (e.g., a polar decoding operation) on a portion of the codeword (e.g., a segment of the codeword containing a host data sector), and determine whether the decoded portion of the codeword satisfies the request. If the request is satisfied, the decoder component 113 can terminate the decoding operation for remaining portions of the codeword. Further details with regards to the operations of the decoder component 113 are described below.

Figure 2:
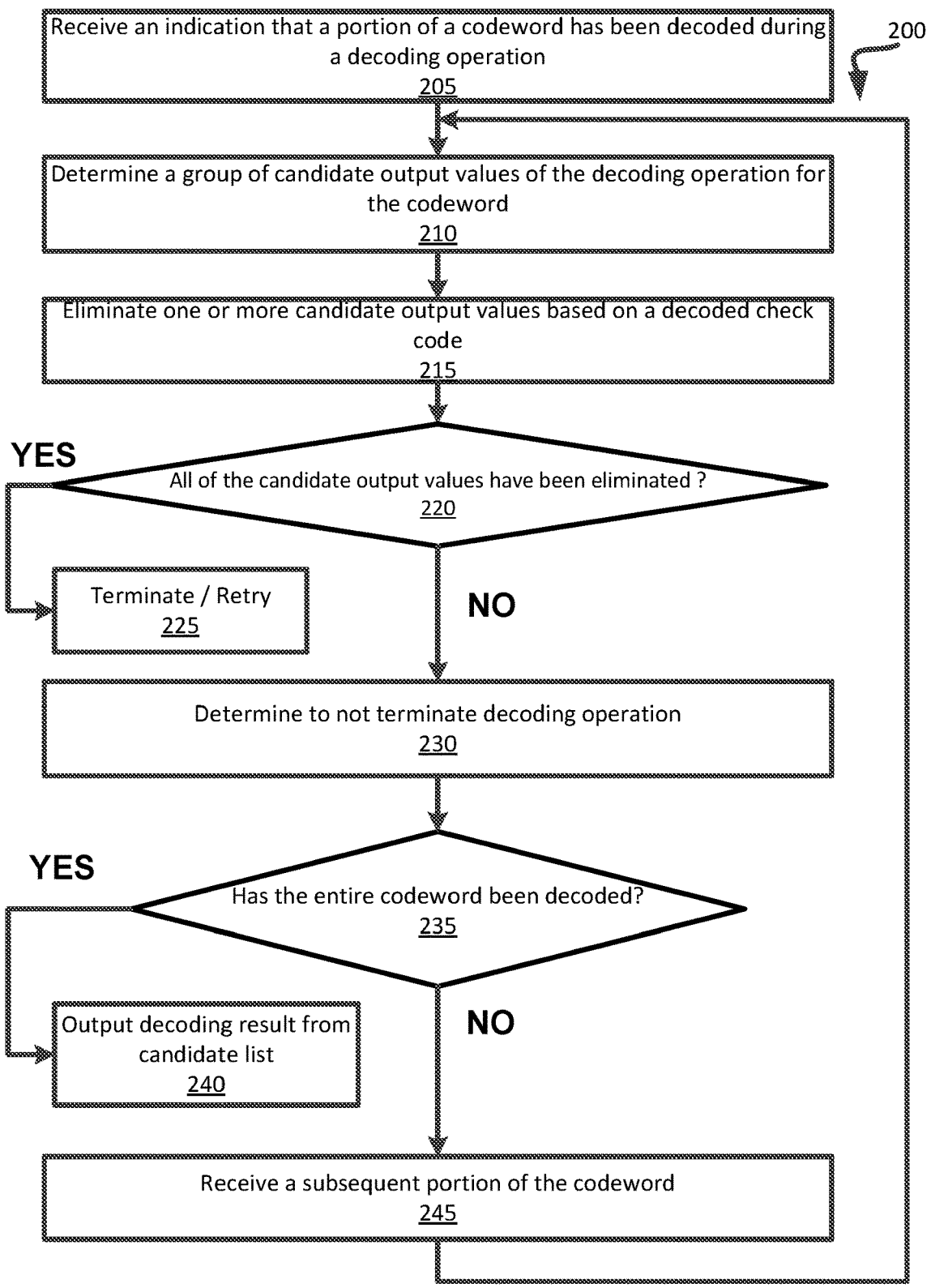
FIG. 2 is a flow diagram of an example method to perform early decoding termination for a memory sub-system based on check code validation of decoded host data sectors of a potential candidate for a codeword in accordance with some embodiments of the present disclosure.

FIG. 2 is a flow diagram of an example method 200 to perform early decoding termination for a memory sub-system based on check code validation of decoded host data sectors of a potential candidate for a codeword, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the decoder component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 205, the processing logic receives an indication that a portion of a codeword has been decoded during a decoding operation. For example, a polar decoder can be used to decode the portion of the codeword to generate host data. For example, operation 205 can be invoked by the polar decoder that has decoded the portion of the codeword. In some embodiments, the codeword can be made up of a series of segments. For example, the codeword can include a set of segments that correspond to different host data sectors included within the codeword. Additionally, the codeword can include another set of segments that correspond to check codes for each segment that includes a host data sector. Thus, the segments can be organized in pairs such that each host data sector is paired with a corresponding check code. In some embodiments, the check code can be a cyclic redundancy check (CRC) code. A CRC code is an error-detecting code that can be used to detect unintentional changes to raw data. In some embodiments, the portion of the codeword that has been decoded during the decoding operation by the polar decoder can be the host data of a particular segment of the codeword. In some embodiments, operation 205 can be invoked by the polar decoder upon reaching a validation point in the codeword. A validation point can represent the location in a codeword that marks the ending location of a host data sector and its associated check code. Additionally, the end of a codeword can also be considered a validation point.

At operation 210, the processing logic determines a group of candidate output values of the decoding operation for the codeword. In some embodiments, the group of candidate output values corresponds to a group of potential output values of the polar decoding operation for the codeword. For example, the processing logic can generate a list of candidate data values that can potentially match the expected decoded host data that is to be the result or final output of the decoding operation for the codeword. In the case of polar codes, the decoder can choose the most likely candidates based on known frozen bits as well as check codes associated with each host data sector. In some embodiments, each potential candidate output value can include its own decoded host data sector and decoded sector check code that correspond to the host data sector and sector check code of the segments of the codeword that have been decoded at a particular validation point.

At operation 215, the processing logic eliminates one or more candidate output values based on a decoded check code associated with the candidate output value. In some implementations, the processing logic of a polar decoder can check the match between the decoded host data sector and the decoded sector check code for each potential candidate. For example, the polar decoder can determine whether the decoded host data sector and the decoded sector check code satisfies the constraints prescribed by a property of the check code known to the decoder. If the decoded host data sector of a candidate matches the corresponding decoded sector check code of the candidate, that candidate is considered valid and can be retained in the candidate list. Conversely, if the decoded host data sector does not match the decoded sector check code, the candidate is considered invalid and will be discarded. In some implementations, the polar decoder can execute the matching process by generating a check code for the decoded host data sector using the same constraints as the algorithm used to generate the check codes for the codeword during the encoding process. The decoder can then compare the generated check code to the value for the decoded sector check code of the candidate to determine if the decoded sector check code is a valid value for the decoded host data sector.

At operation 220, the processing logic determines whether all of the candidate output values have been eliminated by the process executed by operation 220. For example, if none of the candidate output values pass the matching test described above at operation 215, then all of the candidate output values will be eliminated from further consideration. In response to determining that all of the candidate output values have been eliminated from the group determined at operation 210, processing logic proceeds to operation 225. At operation 225, the processing logic terminates the decoding operation for remaining portions of the codeword. In some embodiments, the processing logic can alternatively attempt a read/retry operation for the portion of the codeword. In such instances, processing logic can retrieve the portion of the codeword again, perform the decoding operation again, and repeat operations 205-220. In some embodiments, the read/retry operation can correspond to a changed or different read threshold voltage being applied to retrieve the codeword.

In response to determining (at operation 220) that at least one of the candidate output values has not been eliminated from the group determined at operation 210, processing continues to operation 230. At operation 230, the processing logic determines to not terminate the decoding operation. For example, the polar decoder can determine that the decoding operation should continue to decode remaining portions (e.g., additional host data sectors) of the codeword. Processing can then continue to operation 235.

At operation 235, processing logic determines whether the entire codeword has been decoded by the polar decoder. In some implementations, the processing logic can make this determination by passing the final validation point of the codeword. In other words, once the decoder has processed the last host data sector and check code pair in the codeword, and there is at least one candidate output value remaining that has not been eliminated, the decoder can determine that the entire codeword has been decoded. In response to determining that the entire codeword has been decoded, processing can proceed to operation 240. At operation 240, processing logic can output the decoding result from the candidate output value (or values) that remain in the group. In some embodiments, there may be only one candidate output value remaining. Alternatively, there may be multiple candidate output values remaining. In this latter instance, the decoder may rank the remaining output values according to a probability measurement. In some implementations, the decoder can output the decoding result by returning the result to the process that requested the decoded codeword.

In response to determining (at operation 235) that the entire codeword has not been decoded, processing continues to operation 245. At operation 245, the processing logic receives a subsequent portion of the codeword. In some embodiments, the subsequent portion of the codeword can be in a location of the codeword that is after a location of the portion of the same codeword that was decoded at operation 205. In some embodiments, the processing logic can then repeat operations 210-240 for the subsequent portions of the codeword, where processing logic can determine whether at least one of the plurality of candidate output values passes the validation process. This process can repeat until the entire codeword is decoded or a subsequent determination is made to terminate the process based on an error detected (i.e. all potential candidates are discarded) with a subsequent host data sector as described above.

Figure 3A:
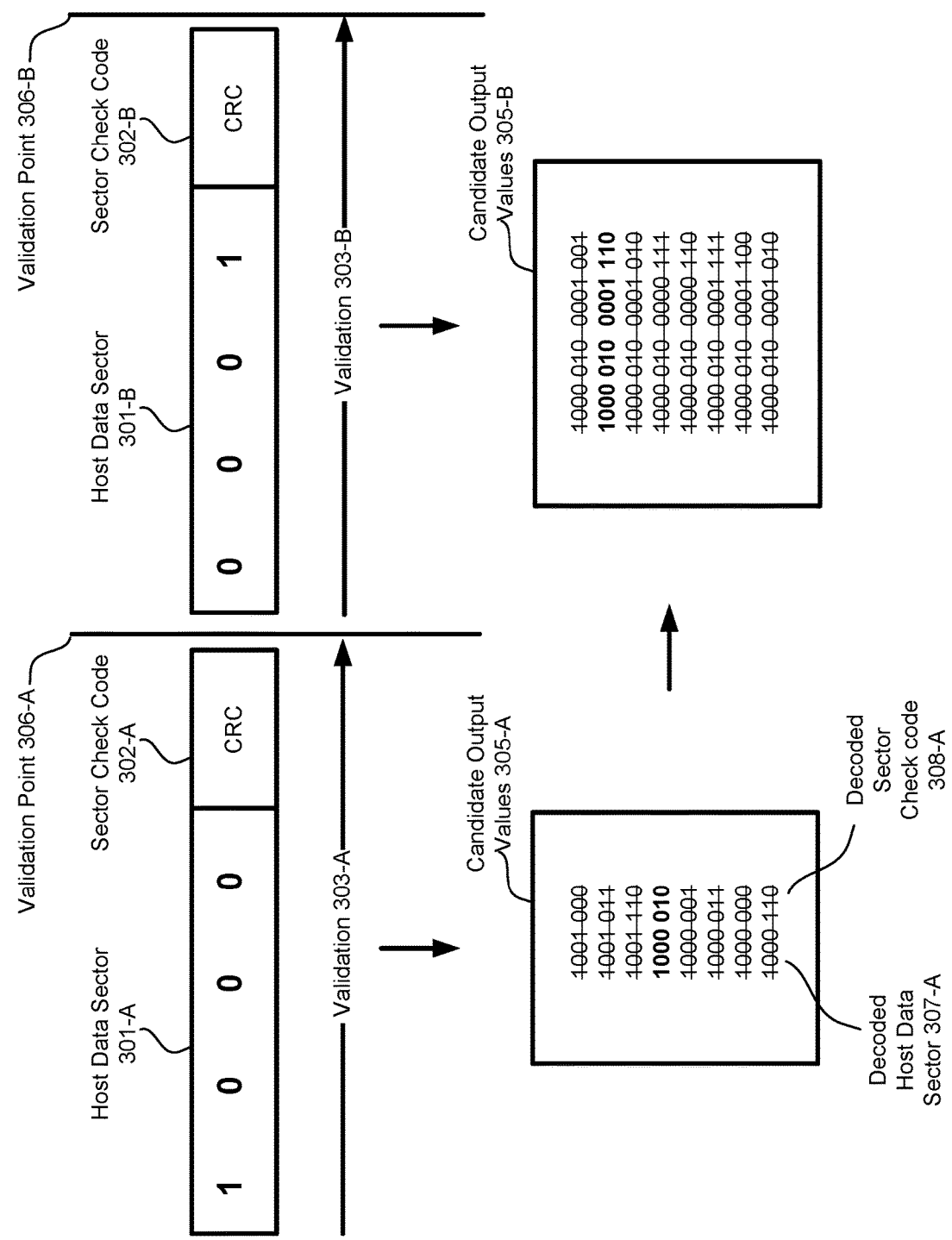
FIG. 3A illustrates check code validation of decoded host data sectors of a potential candidate for a codeword in accordance with some embodiments of the present disclosure.

FIG. 3A illustrates check code validation of decoded host data sectors of a potential candidate for a codeword in accordance with some embodiments of the present disclosure. The check code validation of host data sectors can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, check code validation of host data sectors of a codeword can be performed by the decoder component 113 of FIG. 1.

As described above, in some embodiments, a codeword can include multiple segments, where some segments include host data sectors and others include check codes associated with the host data sector segments. A decoding operation as described above with respect to FIG. 2 can eliminate potential candidates for a decoded codeword based on validating each decoded host data sector using its corresponding decoded sector check code. In some embodiments, a cyclic redundancy check (CRC) can be used to validate the host data sector and/or the codeword generated by a polar encoder.

As shown in FIG. 3A, the decoding operation can decode a codeword that includes host data sector 301-A, sector check code 302-A, host data sector 301-B, and sector check code 302-B. It should be noted that in some embodiments, the values depicted in host data sector 301-A, sector check code 302-A, host data sector 301-B, and sector check code 302-B can be unknown to the decoder before the decoding starts. It should also be noted that while for simplicity of illustration, FIG. 3A depicts two host data sector segments in the codeword, in some embodiments, the codeword can include fewer or more segments to be decoded. As noted above with respect to FIG. 2, a polar decoder can execute a decoding operation on a segment of a codeword. The decoding operation can begin by decoding host data sector 301-A one bit at a time to generate a group of candidate output values (e.g., candidate output values 305-A). In some embodiments, the decoding operation can execute this process in stages, processing one host data sector at a time. As shown in FIG. 3A, the polar decoder can decode the portion of the codeword bound by validation point 306-A (e.g., host data sector 301-A and sector check code 302-A).

The decoder, upon receiving an indication that the decoding operation has complete for the segment of the codeword, begins validation 303-A to eliminate any invalid candidate values from candidate output values 305-A. As shown in FIG. 3A, each potential candidate output values in candidate output values 305-A can include its own decoded host data sector (decoded host data sector 307-A) and decoded sector check code (decoded sector check code 308-A) that correspond to host data sector 301-A and sector check code 302-A that have been decoded at validation point 306-A. Validation 303-A can then conduct a validation process for each potential candidate in candidate output values 305-A to determine whether decoded host data sector 307-A and decoded sector check code 308-A satisfy the constraints prescribed by a property of sector check code 302-A known to the decoder. If decoded host data sector 307-A matches decoded sector check code 308-A of the candidate, that candidate is considered valid and can be retained in the candidate output values 305-A. Conversely, if decoded host data sector 307-A does not match the decoded sector check code 308-A, the candidate is considered invalid and will be discarded.

For example, as shown in FIG. 3A, for candidate '1000 010' in candidate output values 305-A, the corresponding decoded host data sector 307-A and the decoded sector check code 308-A are '1000' and '010' respectively. The decoder can then verify, based on the constraints prescribed by the property of the check code, whether '010' is a valid check code value for a host data sector value of '1000'. Assuming that '1000' matches '010', the candidate '1000 010' (illustrated in bold type) can be retained for further consideration by the decoding operation. Similarly, other candidates (illustrated using a strikethrough) can be eliminated because they are unable to pass this match test. This subset of candidate output values 305-A can be retained to later generate candidate output values 305-B and used by the decoding operation when decoding a subsequent host data sector.

As described above with respect to FIG. 2, in response to determining that at least one of the candidate output values of candidate output values 305-A has not been eliminated, processing logic can determine to not terminate the decoding operation. In some embodiments, the decoding operation can then repeat the process for the next available host data sector in the codeword. In some embodiments, as shown in FIG. 3A, candidate list 305-B includes only the subset of potential candidates that were retained from candidate list 305-A once validation 303-A completed (e.g., those candidates that begin with a bit pattern of '1000 010'). At validation 303-B, a new round of checks between the decoded host data sector and the decoded sector check code for each potential candidate is carried out. After validation 303-B, the bit pattern '1000 010 0001 110' is retained in the subset of candidate output values 305-B because decoded host data sector '0001' matches with decoded check code '110', while other candidates (illustrated using a strikethrough) are eliminated because they are unable to pass the match test. This subset of candidate output values 305-B can be retained and used by the decoding operation when decoding a subsequent host data sector.

In some embodiments, upon completion of the decoding operation (e.g., once the entire codeword has been decoded), if only one candidate remains in the candidate output values, the remaining candidate can be deemed as the final decoding result, and the relevant host data portion will be returned to the host system. In other embodiments, upon completion of the decoding operation, multiple candidates can remain in the candidate list. In such instances, the most likely candidate (e.g., based on a probability measurement) can be deemed as the final decoding result and its relevant host data portion will be returned to the host system.

Figure 3B:
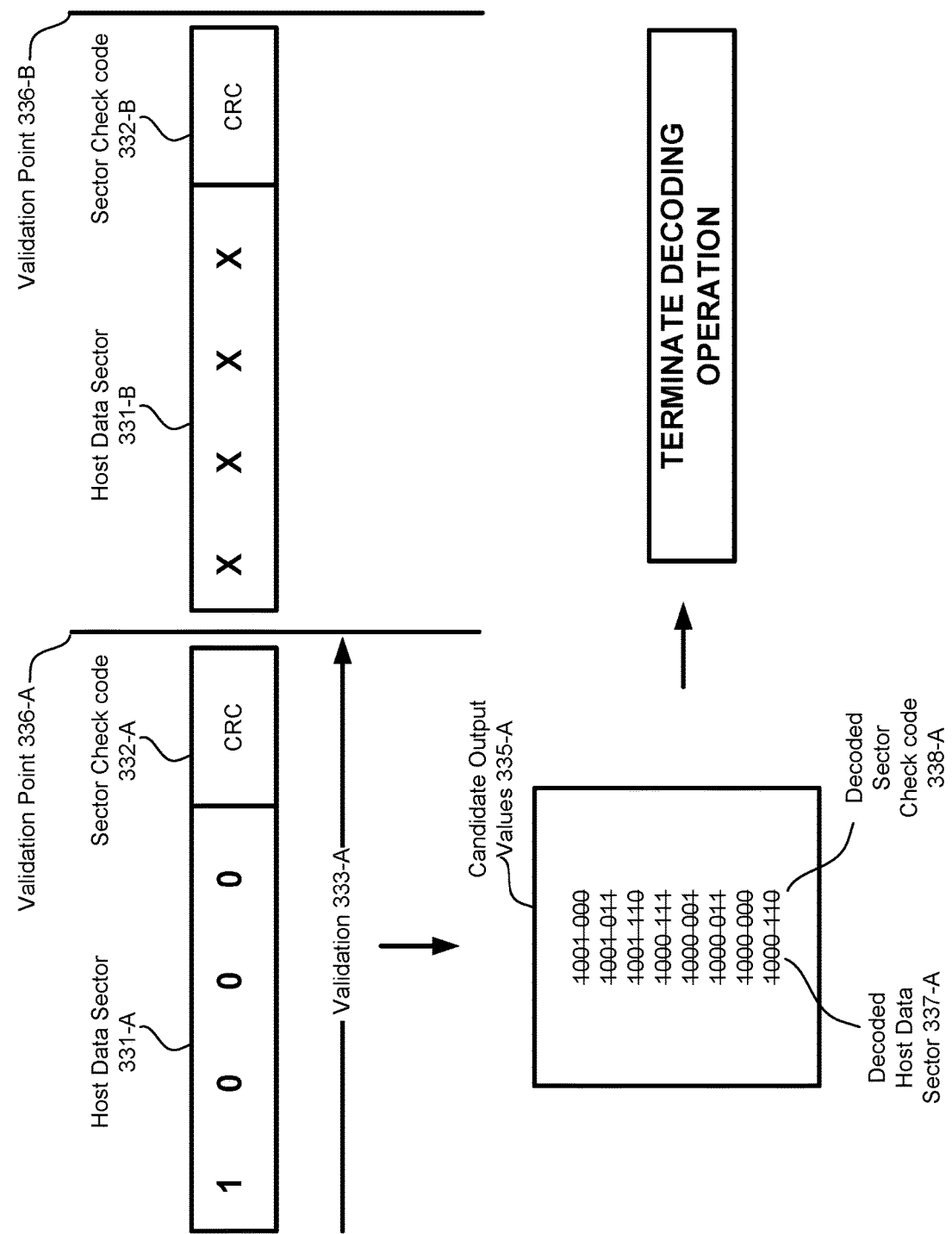
FIG. 3B illustrates early decoding termination for a memory sub-system based on candidate output values for decoded host data in accordance with some embodiments of the present disclosure

FIG. 3B illustrates early decoding termination for a memory sub-system based on candidate output values for decoded host data in accordance with some embodiments of the present disclosure. The early decoding termination can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, early decoding termination for a memory sub-system can be performed by the decoder component 113 of FIG. 1.

As shown in FIG. 3B, the decoding operation can decode a codeword that includes host data sector 331-A, sector check code 332-A, host data sector 331-B, and sector check code 332-B. It should be noted that in some embodiments, the values depicted in host data sector 331-A, sector check code 332-A, host data sector 331-B, and sector check code 332-B can be unknown to the decoder before the decoding starts. It should also be noted that while for simplicity of illustration, FIG. 3B depicts two host data sector segments in the codeword, in some embodiments, the codeword can include fewer or more segments to be decoded. The decoding operation can begin by decoding host sector data 331-A to generate to generate a group of candidate output values (e.g., candidate output values 335-A). In some embodiments, the decoding operation can execute this process in stages, processing one host data sector at a time. As shown in FIG. 3B, the polar decoder can decode the portion of the codeword bound by validation point 336-A (e.g., host data sector 331-A and sector check code 332-A).

The decoder, upon receiving an indication that the decoding operation has complete for the segment of the codeword, begins validation 333-A to eliminate any invalid candidate values from candidate output values 335-A. As shown in FIG. 3B, each potential candidate output values in candidate output values 335-A can include its own decoded host data sector (decoded host data sector 337-A) and decoded sector check code (decoded sector check code 338-A) that correspond to host data sector 331-A and sector check code 332-A that have been decoded at validation point 336-A. Validation 333-A can then conduct a validation process as described above with respect to FIG. 2 and FIG. 3A for each potential candidate in candidate output values 335-A to determine whether decoded host data sector 337-A and decoded sector check code 338-A satisfy the constraints prescribed by a property of sector check code 332-A known to the decoder.

As shown in FIG. 3B, the result of the validation 333-A operation can indicate that none of the potential candidates in candidate output values 335-A successfully passed the match test described above. In other words, for each potential candidate, the decoded sector check code 338-A was not a valid check code for the corresponding decoded host data sector 337-A. For example, as shown in FIG. 3B, for candidate '1001 000' from candidate output values 335-A, the corresponding decoded host data sector 337-A and the decoded sector check code 338-A are '1001' and '000' respectively. The decoder can then verify, based on the constraints prescribed by the property of the check code, whether '000' is a valid check code value for a host data sector value of '1001'. Assuming that '1001' does not match '010', the candidate '1001 000' (illustrated using a strikethrough) can be eliminated for further consideration by the decoding operation. Assuming the other candidate values depicted in candidate output values 335-A (illustrated using a strikethrough) are unable to pass this match test, they can be similarly eliminated.

As described above with respect to FIG. 2, once validation 333-A has completed, the polar decoder can then determine whether all of the candidate output values (e.g., candidate output values 335-A) have been eliminated. As shown in FIG. 3B, candidate output values 335-A does not include any remaining potential candidates. This can indicate that while the validation 333-A completed successfully, another error occurred at some point during the decoding operation, indicating a decoding failure. In such cases, the polar decoder can terminate the decoding operation for remaining portions of the codeword. For example, the decoding operation can be terminated without decoding host data 331-B.

Figure 4:
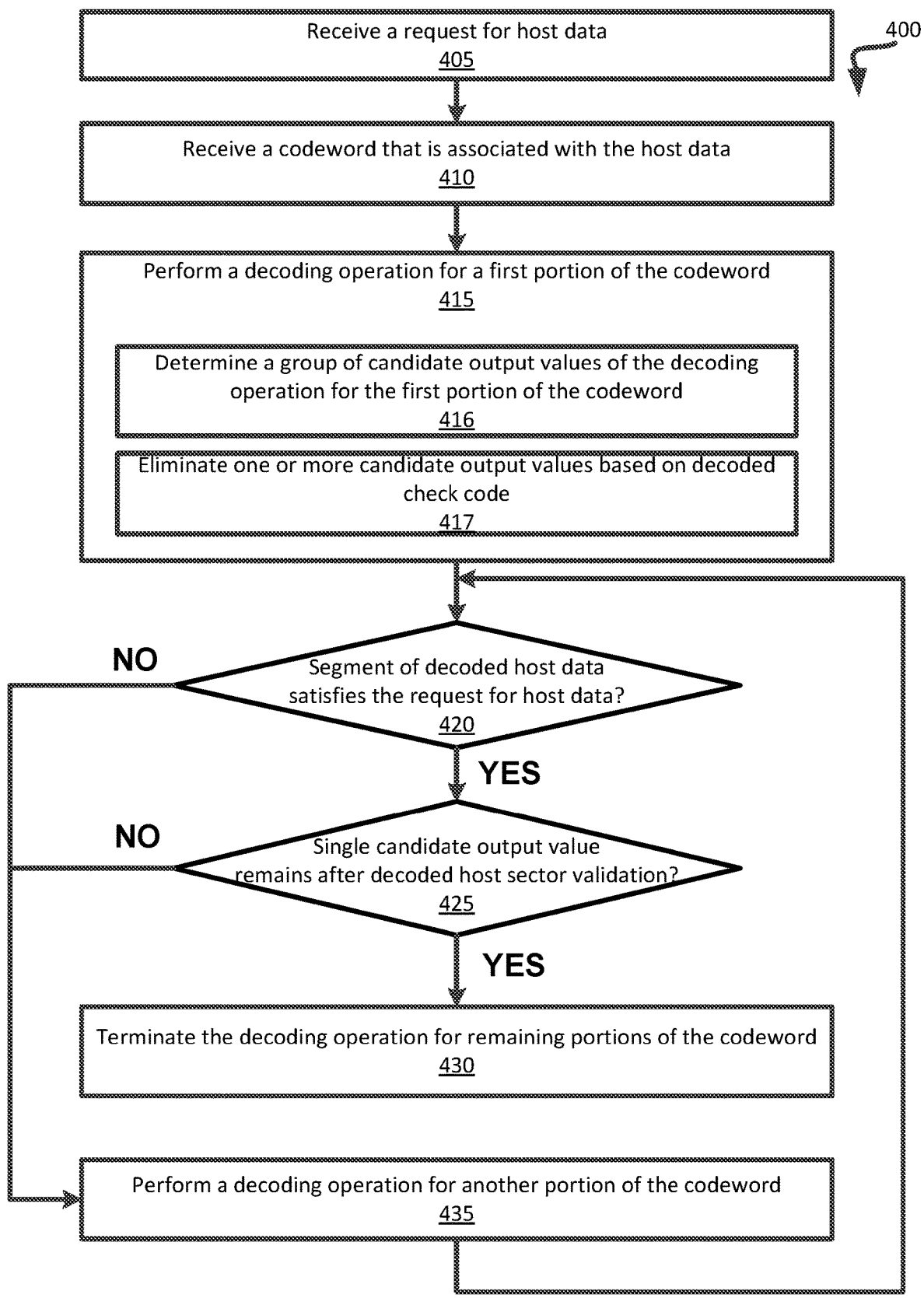
FIG. 4 is a flow diagram of an example method to perform early decoding termination for a memory sub-system based on whether a sufficient amount of data has been decoded to satisfy a request in accordance with some embodiments of the present disclosure.

FIG. 4 is a flow diagram of an example method 400 to perform early decoding termination for a memory subsystem based on whether a sufficient amount of data has been decoded to satisfy a request, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the decoder component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 4, at operation 405, the processing logic receives a request for host data. For example, the request can be a request received from a host system to read host data associated with a particular logical block address (LBA). At operation 410, the processing logic receives a codeword that is associated with the requested host data. The codeword can be received in response to the read request described in operation 405 that specifies host data that was previously encoded into the codeword. As previously described, the codeword can be made up of a series of segments. For example, the codeword can include a set of segments that correspond to different host data sectors included within the codeword. Additionally, the codeword can include another set of segments that correspond to check values for each segment that includes a host data sector. Thus, the segments can be organized in pairs such that each host data sector is paired with a corresponding check code. In some embodiments, the check code can be a cyclic redundancy check (CRC) code. A CRC code is an error-detecting code that can be used to detect unintentional changes to raw data.

At operation 415, the processing logic performs a decoding operation for a first portion of the codeword received by operation 410 to generate a segment of decoded host data. For example, a polar decoder can be used to decode the codeword to generate the host data. As described above, the codeword can include multiple host data sectors. In some embodiments, the processing logic can perform the decoding operation for one of the host data sectors of the codeword. For example, a polar decoder can perform a decoding operation on the codeword until a validation point is reached. In some embodiments the results of the decoding operation can be a list of potential candidates as described above with respect to FIGS. 2-3B.

In one embodiment, the processing logic can perform the decoding operation by performing operations 416 and 417. At operation 416, the processing logic determines a group of candidate output values for the first portion of the codeword. In some embodiments, the group of candidate output values corresponds to a plurality of potential output values of the decoding operation for the codeword. For example, the processing logic can generate a list of candidate data values that can potentially match the expected decoded host data. In some embodiments, the processing logic determine the group of candidate output values as described above with respect to operation 210 of FIG. 2. At operation 417, the processing logic eliminates one or more candidate output values based on a decoded check code associated with the candidate output value. For example, as described above with respect to operation 215 of FIG. 2, the polar decoder can determine whether the decoded host data sector and the decoded sector check code satisfies the constraints prescribed by a property of the check code known to the decoder. If the decoded host data sector of a candidate matches the corresponding decoded sector check code of the candidate, that candidate is considered valid and can be retained in the candidate list. Conversely, if the decoded host data sector does not match the decoded sector check code, the candidate is considered invalid and can be discarded. As noted above, in some embodiments, if the validation process eliminates all potential candidates from the list, processing logic can terminate the decoding operation early.

At operation 420, the processing logic determines whether the segment of the decoded data (e.g., the host data sector decoded at operation 415) satisfies the request for host data (e.g., the request received at operation 405). In some embodiments, processing logic can make this determination by determining whether the data range associated with candidate output values for the segment of the decoded data matches the data range associated with the host data. For example, the decoder can determine that the decoded data (e.g. the data range covered by the candidate output values) is sufficient to cover the amount of host data requested at operation 405 and thus satisfies the request. In some embodiments, the decoder can determine if the request is satisfied based on a logical block address (LBA) associated with the request combined with the amount of data requested. Thus, the decoder can determine that the request is satisfied if the amount of requested host data is covered in the range between the start of the codeword and the most recently processed segment. In some situations, the request can be satisfied when the number of decoded host data sectors is less than the total number of sectors stored in the entire codeword. Thus, if processing logic determines that the decoded host data from the host data sector decoded at operation 415 (or the range of decoded host data sectors between the start of the codeword and the current validation point) is sufficient to cover the data needed for the request, the request has been satisfied. In some embodiments, a request can be satisfied by one or more sectors of a single codeword without needing the entire codeword to be decoded. Alternatively, a request can be satisfied by multiple codewords where only a portion of the last codeword is needed to complete the data to satisfy the request.

In response to determining that the segment of the decoded data satisfies the request for the host data (e.g., the decoded data range of candidate output values covers the host data requested by operation 405), processing logic can proceed to operation 425. In response to determining that the segment of decoded data does not satisfy the request for host data (e.g., the decoded data range of candidate output values does not cover the host data requested by operation 405), processing logic can proceed to operation 435. At operation 425, processing logic determines whether a single candidate output value has been validated for the decoding operation described above at operation 415. For example, the validation process described above with respect to operation 417 can eliminate candidate output values for the codeword. Any candidate not eliminated can be deemed valid. Processing logic can determine that a single candidate output value has been validated if the decoding operation has eliminated all but a single candidate output value. Thus, if this condition occurs, additional decoding can be unnecessary since a sufficient amount has been decoded to satisfy the amount of data requested and there are no other potential candidates for the decoded host data. In this case, processing can proceed to operation 430. If, on the other hand, more than a single candidate output value has been validated (e.g., more than one candidate output value remains after the decoding operation), processing can proceed to operation 435.

At operation 430, the processing logic terminates the decoding operation for the remaining portions of the codeword. In some embodiments, processing logic can provide the decoded data to the host system in response to the request received at operation 405.

At operation 435, the processing logic can perform the decoding operation for a second portion of the codeword that is associated with the host data. For example, the processing logic can perform the decoding operation for the next sequential host data sector of the codeword. In some embodiments, the processing logic can then repeat operations 420-430/435 for the subsequent portions of the codeword (e.g., until the decoder encounters the next validation point in the codeword). This process can repeat until the entire codeword is decoded or a subsequent determination is made to terminate the decoding operation based on whether the decoded data range of candidates covers the requested host data range. Further details with respect to early decoding termination based on whether a sufficient amount of data has been decoded to satisfy a request are described below in conjunction with FIG. 5.

Figure 5:
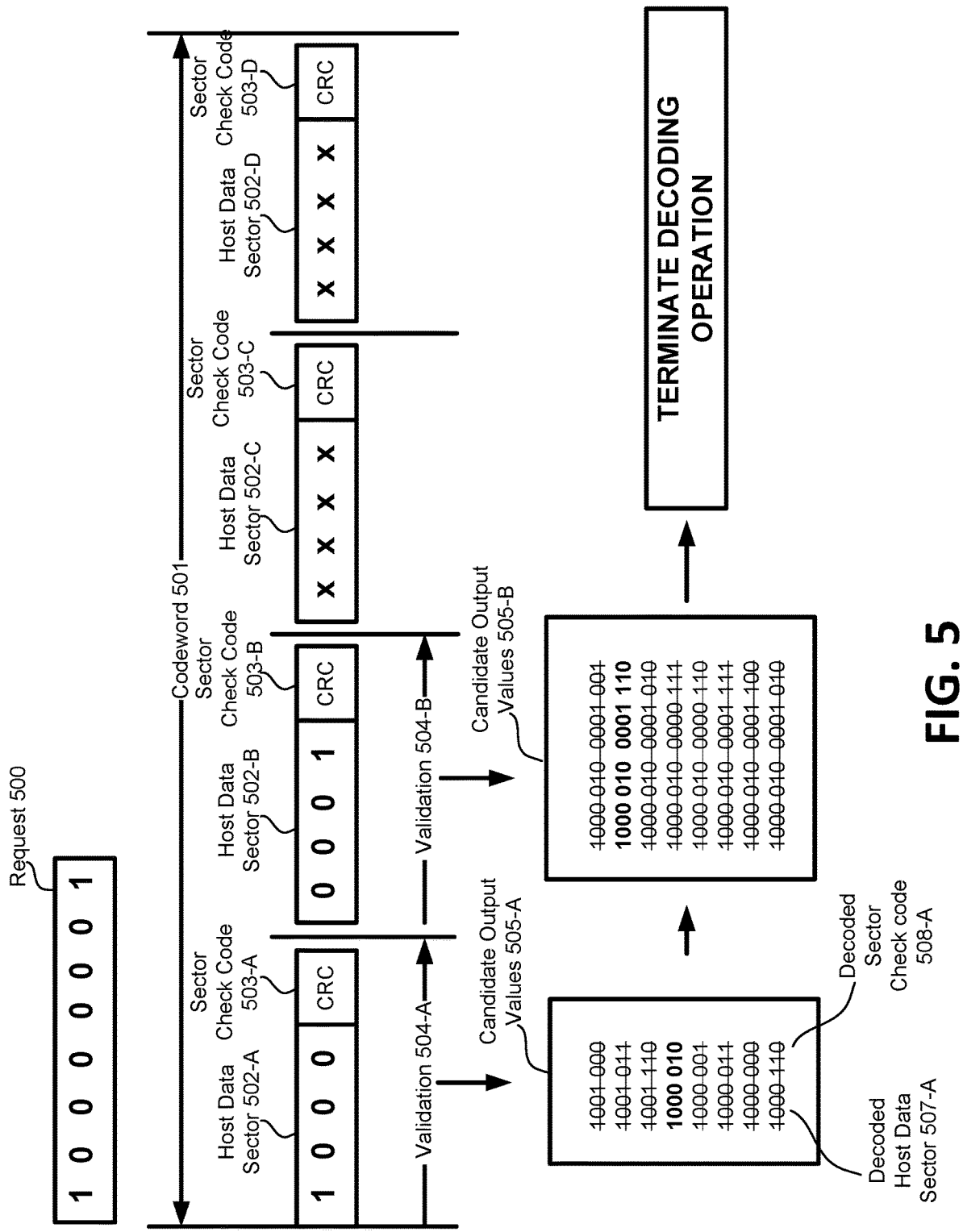
FIG. 5 illustrates early decoding termination based on whether a sufficient amount of data has been decoded to satisfy a request in accordance with some embodiments of the present disclosure.

FIG. 5 illustrates early decoding termination for a memory sub-system based on whether a sufficient amount of data has been decoded to satisfy a request in accordance with some embodiments of the present disclosure. The elimination of potential candidates can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, early decoding termination for a memory sub-system by the decoder component 113 of FIG. 1.

As described above with respect to FIG. 4, a decoding operation can eliminate potential candidates for a decoded codeword based on validating the candidates for each segment using the corresponding check code. In some embodiments, a cyclic redundancy check (CRC) can be performed with the decoded host data to validate potential candidate output values for the host data sector.

As shown in FIG. 5, the decoding operation can decode a codeword 501 that includes host data sector 502-A, sector check code 503-A, host data sector 502-B, sector check code 503-B, host data sector 502-C, sector check code 503-C, host data sector 502-D, and sector check code 503-D. It should be noted that while for simplicity of illustration, FIG. 5 depicts four host data sector segments (and associated sector check codes) in the codeword 501, in some embodiments, the codeword 501 can include fewer or more segments to be decoded. In some embodiments, the decoding operation can be initiated in response to receiving a request for host data (e.g., request 500). The decoding operation can begin by decoding host data sector 502-A and sector check code 503-A (e.g., the portion of the codeword 501 bound by the first validation point) to generate a group of potential candidate values (e.g., candidate output values 505-A). The decoding operation can then begin validation 504-A to eliminate any invalid candidate values from candidate output values 505-A. As described above, validation 504-A can conduct a validation process for each potential candidate in candidate output values 505-A to determine whether decoded host data sector 507-A and decoded sector check code 508-A of each candidate satisfy the constraints prescribed by a property of sector check code 302-A known to the decoder.

For example, as shown in FIG. 5, for candidate '1000 010' in candidate output values 505-A, the corresponding decoded host data sector 507-A and the decoded sector check code 508-A are '1000' and '010' respectively. The decoder can then verify, based on the constraints prescribed by the property of the check code, whether '010' is a valid check code value for a host data sector value of '1000'. Assuming that '1000' matches '010', the candidate '1000 010' (illustrated in bold type) can be retained for further consideration by the decoding operation. Similarly, other candidates (illustrated using a strikethrough) can be eliminated because they are unable to pass this match test. This subset of candidate output values 505-A can be retained to later generate candidate output values 505-B and used by the decoding operation when decoding a subsequent host data sector.

As described above with respect to FIG. 4, once host data sector 502-A has been decoded (e.g., when validation 504-A completes), the polar decoder can then determine whether it satisfies the request for host data (e.g., request 500). As noted above, this determination can be made by determining whether the range of data covered by the candidates in candidate output values 505-A is sufficient to cover the amount of data requested by request 500. As shown in FIG. 5, the range of data included in decoded host data sector 502-A is not sufficient to satisfy request 500 (e.g., the amount of data covered by the candidates in candidate output values 505-A is less than what has been requested by request 500), so the polar decoder can then repeat the process for the next available host data sector in the codeword 501 (e.g., until the next validation point is reached). The decoding operation can decode host data sector 502-B and sector check code 503-B (e.g., the portion of the codeword 501 bound by the next validation point) to generate an updated group of potential candidate values (e.g., candidate output values 505-B). The decoding operation can then begin validation 504-B to eliminate any additional invalid candidate values from candidate output values 505-B.

In some embodiments, as shown in FIG. 5, candidate list 505-B includes only the subset of potential candidates that were retained from candidate list 505-A once validation 504-A completed (e.g., those candidates that begin with a bit pattern of '1000 010'). At validation 504-B, a new round of checks between the decoded host data sector and the decoded sector check code for each potential candidate is carried out. After validation 504-B, the bit pattern '1000 010 0001 110' is retained in the subset of candidate output values 505-B because decoded host data sector '0001' matches with decoded check code '110', while other candidates (illustrated using a strikethrough) are eliminated because they are unable to pass the match test. This subset of candidate output values 505-B can be retained and used by the decoding operation when decoding a subsequent host data sector.

As described above with respect to FIG. 4, once host data sector 502-B has been decoded, the polar decoder can then determine whether the range of data covered by the combined host data from decoded host data sector 502-A and decoded host data sector 502-B satisfies the request for host data (e.g., request 500). As noted above, this determination can be made if the range of data covered by the candidates in candidate output values 505-B is sufficient to cover the amount of data requested by request 500. As shown in FIG. 5, the range of data included in the candidate output values of 505-B does satisfy request 500 (e.g., the amount of data covered by the candidates in candidate output values 505-B matches what has been requested by request 500)). It should be noted that for clarity of illustration, FIG. 5 depicts request 500 as requesting 8 bits of host data, but in some embodiments that amount of data requested can be less than 8 bits or greater than 8 bits. In some embodiments, request 500 can include a logical block address (LBA) that indicates a stored location associated with the host data as well as an amount of data to retrieve. In such cases, the polar decoder can determine that the decoded data satisfies the request based on the LBA combined with the amount of data retrieved and decoded rather than the actual content of the data. In some embodiments, the decoder can make this determination if the requested host data is covered in the range between the start of the codeword 501 and the most recently processed validation point.

As shown in FIG. 5, once the polar decoder has determined that the amount of decoded host data (e.g., the range of decoded data for host data sector 502-A and host data sector 502-B covered in candidate output values 505-B) has satisfied requested data size from request 500, the decoding operation can be terminated for remaining portions of the codeword. For example, the decoding operation can be terminated without decoding host data 502-C and 502-D. In some embodiments, as described above with respect to FIG. 4, the polar decoder can determine whether to terminate the decoding operation based in part on the remaining candidates in candidate output values 505-B. For example, as shown in FIG. 5, candidate output values 505-B includes a single candidate output value after the completion of validation 504-B for host data sector 502-B (e.g., the candidate with the bit pattern '1000 010 0001 110'). Thus, since the amount of host data to satisfy request 500 had been decoded and there is only a single candidate output value remaining, the polar decoder can terminate the decoding operation for remaining portions of the codeword. If however, there were more than one candidate remaining in candidate output values 505-B (not depicted in FIG. 5), the polar decoder can continue to perform the decoding operation for subsequent host data sectors (e.g., host data 502-C and host data 502-D) until only a single candidate output value remains. In some implementations, the polar decoder can then return the bit pattern to the host that corresponds to the decoded host data sectors. For example, for the remaining bit pattern the bit pattern '1000 010 0001 110', the decoded host data sectors are '1000' and '0001'. Thus, the decoder can return '1000 0001' to the host.

Figure 6:
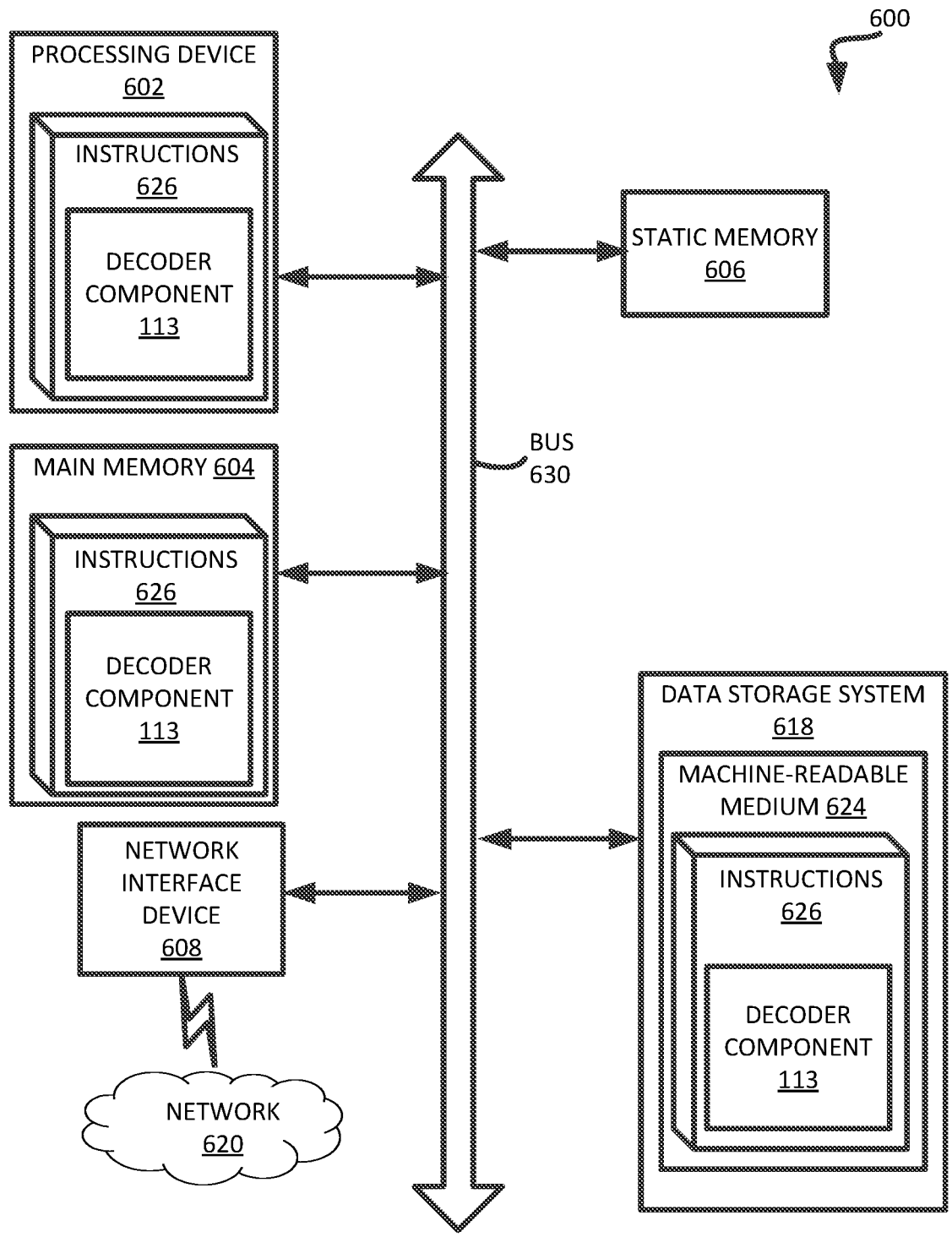
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to decoder component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a decoder component (e.g., the decoder component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving an indication that a portion of a codeword has been decoded during a decoding operation;
determining a plurality of candidate output values of the decoding operation for the portion of the codeword;
eliminating one or more candidate output values from the plurality of candidate output values based on a decoded check code for each of the plurality of candidate output values; and
in response to determining that all of the candidate output values have been eliminated from the plurality of candidate output values, terminating, by a processing device, the decoding operation.

2. The method of claim 1, further comprising:
in response to determining that at least one of the candidate output values has not been eliminated from the plurality of candidate output values, determining to not terminate the decoding operation.

3. The method of claim 2, further comprising:
in response to determining to not terminate the decoding operation, determining whether the entire codeword has been decoded; and
in response to determining that the entire codeword has not been decoded:
receiving a subsequent portion of the codeword, wherein the subsequent portion is in a location of the codeword that is after a location of the portion of the same codeword;
eliminating one or more additional candidate output values from the plurality of candidate output values based on an additional decoded check code for each of the plurality of candidate output values; and
determining whether at least one of the plurality of candidate output values has not been eliminated.

4. The method of claim 3, further comprising:
in response to determining that the entire codeword has been decoded, outputting a decoded result comprising at least one of the plurality of output values that has not been eliminated.

5. The method of claim 1, wherein the plurality of candidate output values comprises a set of potential output values that potentially match an expected decoded host data that is expected to be a result of the decoding operation for the portion of the codeword.

6. The method of claim 1, wherein eliminating the one or more candidate output values further comprises:
identifying a decoded host data sector and a decoded check code for each of the plurality of candidate output values; and
determining that the decoded check code does not match the corresponding decoded host data sector for the one or more candidate output values.

7. The method of claim 1, wherein terminating the decoding operation comprises determining to not perform the decoding operation for remaining portions of the codeword.

8. A system comprising:
a memory component; and
a processing device, operatively coupled with the memory component, to:
receive a request for host data;
receive a codeword that is associated with the host data;
perform a decoding operation for a first portion of the codeword to generate a segment of decoded data;
determine whether the segment of the decoded data satisfies the request for the host data;
in response to determining that the segment of the decoded data satisfies the request for the host data, determine whether a single candidate output value has been validated for the decoding operation; and
in response to determining that a single candidate output value has been validated, terminate the decoding operation for remaining portions of the codeword.

9. The system of claim 8, wherein the processing device is further to:
in response to determining that the segment of the decoded data does not satisfy the request for the host data, perform the decoding operation for a second portion of the codeword that is associated with the host data.

10. The system of claim 8, wherein to perform the decoding operation, the processing device is further to:
determine a plurality of candidate output values of the decoding operation for the codeword; and
eliminate one or more candidate output values from the plurality of candidate output values based on a decoded check code for each of the plurality of candidate output values.

11. The system of claim 10, wherein the processing device is further to:
in response to determining that more than a single candidate output value has been validated, perform the decoding operation for a second portion of the codeword that is associated with the host data.

12. The system of claim 8, wherein the decoding operation is based on a polar decoder.

13. The system of claim 8, wherein to determine whether the segment of the decoded data satisfies the request for the host data, the processing device is further to:
determine whether a first data range associated with candidate output values for the segment of the decoded data matches a second data range associated with the host data.

14. A non-transitory computer readable medium comprising instructions, which when executed by a processing device, cause the processing device to perform operations comprising:
receiving an indication that a portion of a codeword has been decoded during a decoding operation;
determining a plurality of candidate output values of the decoding operation for the portion of the codeword;
eliminating one or more candidate output values from the plurality of candidate output values based on a decoded check code for each of the plurality of candidate output values; and
in response to determining that all of the candidate output values have been eliminated from the plurality of candidate output values, terminating, by a processing device, the decoding operation.

15. The non-transitory computer readable medium of claim 14, wherein the operations further comprise:
in response to determining that at least one of the candidate output values has not been eliminated from the plurality of candidate output values, determining to not terminate the decoding operation.

16. The non-transitory computer readable medium of claim 15, wherein the operations further comprise:
in response to determining to not terminate the decoding operation, determining whether the entire codeword has been decoded; and
in response to determining that the entire codeword has not been decoded:
receiving a subsequent portion of the codeword, wherein the subsequent portion is in a location of the codeword that is after a location of the portion of the same codeword;
eliminating one or more additional candidate output values from the plurality of candidate output values based on an additional decoded check code for each of the plurality of candidate output values; and
determining whether at least one of the plurality of candidate output values has not been eliminated.

17. The non-transitory computer readable medium of claim 16, wherein the operations further comprise:
in response to determining that the entire codeword has been decoded, outputting a decoded result comprising at least one of the plurality of output values that has not been eliminated.

18. The non-transitory computer readable medium of claim 14, wherein the plurality of candidate output values comprises a set of potential output values that potentially match an expected decoded host data that is expected to be a result of the decoding operation for the portion of the codeword.

19. The non-transitory computer readable medium of claim 14, wherein eliminating the one or more candidate output values further comprises:
identifying a decoded host data sector and a decoded check code for each of the plurality of candidate output values; and
determining that the decoded check code does not match the corresponding decoded host data sector for the one or more candidate output values.

20. The non-transitory computer readable medium of claim 14, wherein to terminate the decoding operation, the operations further comprise:

determining to not perform the decoding operation for remaining portions of the codeword.

* * * * *